United States Patent [19]

Blackwell

[11] Patent Number: 5,623,396
[45] Date of Patent: Apr. 22, 1997

[54] ADJUSTABLE PRINTED WIRING BOARD FASTENER

[75] Inventor: Donald A. Blackwell, Saratoga, Calif.

[73] Assignee: Digital Dynamics, Inc., Scotts Valley, Calif.

[21] Appl. No.: 557,849

[22] Filed: Nov. 14, 1995

[51] Int. Cl.⁶ .............................. H05K 7/14; H01R 13/62
[52] U.S. Cl. .......................... 361/801; 361/759; 439/327
[58] Field of Search ..................................... 361/740, 741, 361/747, 756, 759, 796, 801, 802; 439/327, 328; 248/249, 251, 277

[56] References Cited

U.S. PATENT DOCUMENTS

| | | | |
|---|---|---|---|
| 5,383,793 | 1/1995 | Hsu et al. | 439/327 |
| 5,490,038 | 2/1996 | Scholder et al. | 361/759 |

Primary Examiner—Leo P. Picard
Assistant Examiner—Jayprakash N. Gandhi
Attorney, Agent, or Firm—Jeffrey A. Hall

[57] ABSTRACT

An elongated fastening element for securing a wiring board fastener within a personal computer includes a first end element secured to a first fastening section. A central fastening element is secured at one end to the first end element. The central fastening element includes an aperture and a horizontally oriented slot for attachment of the central fastening element to a printed wiring board. A second fastening section is secured at one end to the central fastening element. The second fastening section includes a second end element secured to the second fastening section. The first end element includes an aperture and a pair of vertically oriented slots for adjustably attaching the elongated fastening element to a support element. The second end element includes an aperture and a pair of vertically oriented slots for adjustably attaching the elongated fastening element to the support element.

15 Claims, 2 Drawing Sheets

5,623,396

ADJUSTABLE PRINTED WIRING BOARD FASTENER

BACKGROUND OF THE INVENTION

1. Field of Invention

This invention relates to fastening devices, and particularly to adjustable fasteners for positioning and securing printed wiring boards to a mother board or back plane of a personal computer.

2. Description of the Related Art

Printed wiring boards are devices containing electronic circuitry and components with a specific function or functions used in computers. Add-on printed wiring boards are frequently called cards. A mother board is a master printed wiring board into which various add-on printed wiring boards are connected. Typically mother boards are provided with a series of card edge connectors into which add-on printed wiring boards are inserted. These card edge connectors are electrically coupled by means of a bus structure which defines which signals are carried to each connector pin. Mother boards also typically contain the system computer processor and other functionalities.

Add-on printed wiring boards add both functional capacity and capability to a mother board and are both physically and electronically attached to the mother board by a card edge connector. Examples include disk drive controllers, video controllers, communication functionalities, networks, memory, system interface controllers, and the like. A back plane is a master printed wiring board which add-on printed wiring boards are connected to. Typically, back planes do not have any capability of their own other than to interconnect the add-on printed wiring boards by means of a bus structure. A card cage is a mechanical enclosure of sheet metal and plastic used to house a plurality of printed wiring boards. A printed wiring board hold down device or fastener may be used to hold the printed wiring boards in place in a card cage, so as to prevent damage and movement from vibrations and shocks.

Heretofore, numerous fastening devices have been proposed and implemented to fasten and secure objects to various articles. However, there exists a need for an adjustable, reliable, and easy to use fastening means for positioning and securing printed wiring boards to mother boards or back planes used in personal computers. All prior devices have been cumbersome to use, difficult or impossible to adjust, and expensive to manufacture and replace. The present invention provides a printed wiring board fastener which is adjustable, easy to install resistant to separation at the card edge connector due to forces such as shock, vibration, expansion/contraction creep due to cycling temperatures, which is adaptable to a wide variety of printed wiring board configurations, and which is inexpensive to manufacture and replace.

Accordingly, it is the primary object of this invention to provide a printed wiring board fastener for personal computers which is adjustable, easy to install or replace in a computer, resistant to forces such as shock, vibration and expansion/contraction due to cycling temperatures, which may be installed in new computers or retro-fitted onto existing computers, and which is inexpensive to install, use, and manufacture.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purpose of the invention as embodied and broadly described herein, a printed wiring board hold down or fastener, comprising: an elongated fastening element for securing a wiring board fastener within a personal computer includes a first end element secured to a first fastening section. A central fastening element is secured at one end to the first end element. The central fastening element includes an aperture and a horizontally oriented slot for attachment of the central fastening element to a printed wiring board. A second fastening section is secured at one end to the central fastening element. The second fastening section includes a second end element secured to the second fastening section. The first end element includes an aperture and a pair of vertically oriented slots for adjustably attaching the elongated fastening element to a support element. The second end element includes an aperture and a pair of vertically oriented slots for adjustably attaching the elongated fastening element to the support element.

The printed wiring board fastener may be made of any durable, resilient material, however, plastics, sheet metal, wire, or composites are preferred. The fastener is preferably a single piece molded fastener with integral hinge sections. Means for attachment of the central fastening element to a printed wiring board preferably comprises a slotted element adapted for attachment to the printed wiring board. The slotted element preferably includes a horizontally extending attachment slot operably positioned thereon.

Means for adjustably attaching the printed wiring board fastener of the first end element to a support element preferably comprises a centrally positioned aperture adapted to receive and secure the support element. The first end element further includes a pair of vertically oriented slots adapted to secure and receive a printed wiring board therein.

Means for adjustably attaching the printed wiring board fastener of the second end element to the support element preferably comprises a centrally positioned aperture adapted to receive and secure the support element. The first end element further includes a pair of vertically oriented slots adapted to secure and receive a printed wiring board therein.

BRIEF DESCRIPTION OF THE DRAWINGS

The accompanying drawings, which are incorporated in and constitute a part of the specification, illustrate a preferred embodiment of the invention and, together with a general description given above and the detailed description of the preferred embodiment given below, serve to explain the principles of the invention.

DESCRIPTION OF THE PREFERRED EMBODIMENTS

Reference will now be made in detail to the present preferred embodiments of the invention as illustrated in the accompanying drawings.

In accordance with the present invention, there is provided an adjustable printed wiring board fastener, comprising: an elongated fastening element having a first end element secured to a first fastening section. A central fastening element being secured at one end thereof to the first fastening element and includes means for attachment of the central fastening element to a printed wiring board. A second fastening section is secured at one end to the central fastening element, the second fastening section including a second end element secured to the second fastening section. The first end element includes means for adjustably attaching the elongated fastening element to a support element, and the second end element also includes means for adjustably attaching the elongated fastening element to the support element.

Figure 1:
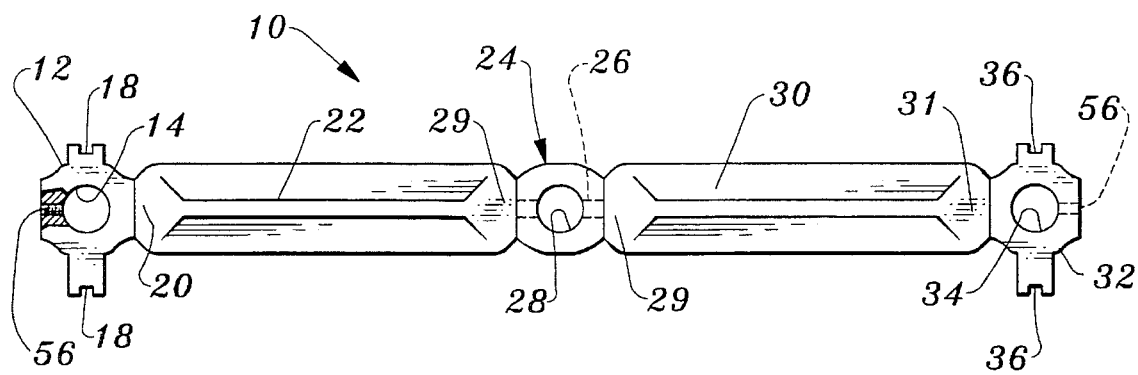
FIG. 1 is top view of a fastener for printed wiring boards, according to the invention.

In FIG. 1, an adjustable printed wiring board fastener 10 is shown according to a preferred embodiment of the invention. Fastener 10 includes an elongated fastening element having a first end element 12 with aperture 14 for operably engagement with a support element 16, and vertically oriented slots or grooves 18 hingedly secured to a first fastening section 22 at hinge or tapered area 20. Preferably hinged or tapered area 20 is integral with first end element 12 and first fastening section 22 as shown in FIG. 1. Vertically oriented slots 18 in first end element 12 are configured for engagement to an edge of a printed wiring board 11 as seen in FIGS. 2–5. A central fastening element 24 is preferably hingedly secured at one end thereof to first fastening section 22. Preferably a hinged or tapered area 29 is formed integrally with first fastening section 22 and central fastening element 24 and comprises a tapered, or hinged area allowing first fastening section 22 to be moved and adjusted in relation to central fastening element 24.

Means for attachment of the central fastening element 24 to a printed wiring board preferably comprise slots 26 positioned in central fastening element 24. An aperture 28 is also preferably positioned in central fastening element 24 and is preferably sized and threaded to receive a extender element 48. A second fastening section 30 with hinged or tapered area 29 is secured at one end to central fastening element 24. Second fastening section 30 includes a second end element 32 hingedly secured with hinge or tapered section 31 to second fastening section 30. Second end element 32 preferably includes aperture 34 preferably sized to retain a support rod and a pair of vertically oriented slots 36 for securing and receiving a printed wiring board.

Aperture 14 in the first end element 12 provide means for adjustably attaching the elongated fastening element to a support element, such as elongated support rod 16. Aperture 34 in second end element 32 provide means for adjustably attaching the elongated fastening element to a support element, such elongated support rod 16.

The adjustable printed wiring board fastener 10 is preferably composed of a durable, resilient material such as plastic. However, alternatively fastener 10 may be composed of sheet metal, wire, composite, or the like. Fastener 10 is preferably provided as a single piece molded fastener with integral hinge sections 20, 29 and 31 best seen in FIG. 1. However, in alternative embodiments, fastener 10 may be provided as a multi-part fastener with hinge pins or stamped from sheet metal or formed from wire.

As shown in FIGS. 2–5, the adjustable printed wiring board fastener 10 is preferably secured at central fastening element 24 to printed wiring board 11 and at first end element 12 and second end element 32 to support element 16 by passing support element 16 through aperture 14 in first end element 12 and through aperture 34 in second end element 32. First end element 12 and second end element 32 are preferably secured to support element 16 by set screws 56 or alternatively by wire spring clamps, sheet metal spring clamps, or other fastening means. In still other embodiments support element 16 may be notched or serrated to engage with tangs integral with end elements 12 and 32. Support element 16 is preferably an elongated rod shaped element, however, various shapes of support element may be used such as angular, square, hexagonal, and the like so as to provide anti-rotation capability.

Support element 16 is secured to card cage 40 mounted on card cage base 42 by screws 38 or alternatively by wire spring clamps, sheet metal spring clamps, or other fastening means. In still other embodiments support element 16 may be notched or serrated with integral tangs.

Figure 2:
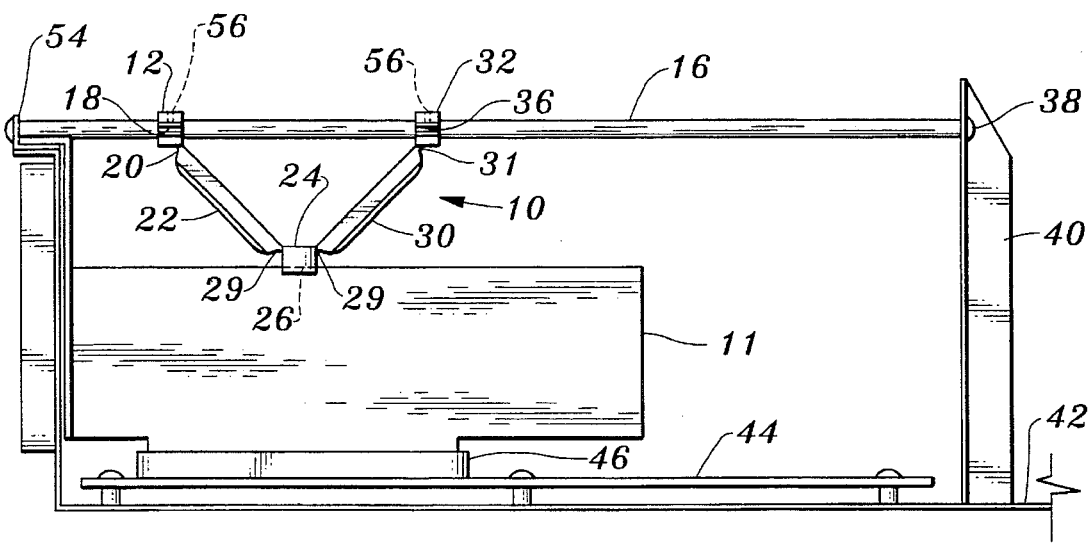
FIG. 2 is a side perspective view of such a fastener attached to a support rod and an add-on printed wiring board, according to the invention.

With specific reference to FIG. 2, add-on printed wiring board 11 is shown operably positioned on edge connector 46 secured to mother board 44. Fastener 10 is shown positioning and securing printed wiring board 11 by securing an edge of printed wiring board 11 to the central fastening element 24 via slots 26. First end element 12 attached to first fastening section 22 is preferably secured to support element 16 via aperture 14 and set screw 56 and second end element 32 secured to second fastening section 30 and is preferably secured to support element 16 via aperture 34 and set screw 56 as previously described.

Figure 3:
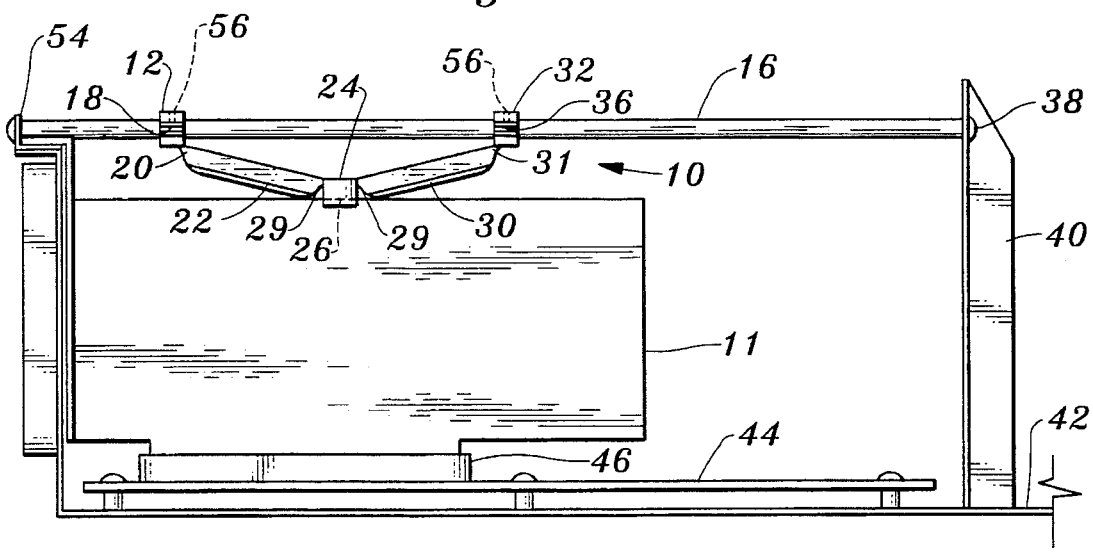
FIG. 3 is a side perspective view of such a fastener attached to a support rod and an add-on .tall printed wiring board, according to the invention.

Referring now to FIG. 3 fastener 10 is shown positioning and securing a tall or wide printed wiring board to support element 16. Note that with printed wiring boards which are tall or wide, the angle between first fastening section 22 and second fastening section 30 will be greater, for example 155 degrees as shown in FIG. 3 than when shorter or more narrow printed wiring boards are being secured such as in FIG. 4. Fastener 10 easily accommodates different size board by hinges 20, 29, and 31 allowing movement of the first and the second fastening sections and the positioning of central fastening element 24.

Figure 4:
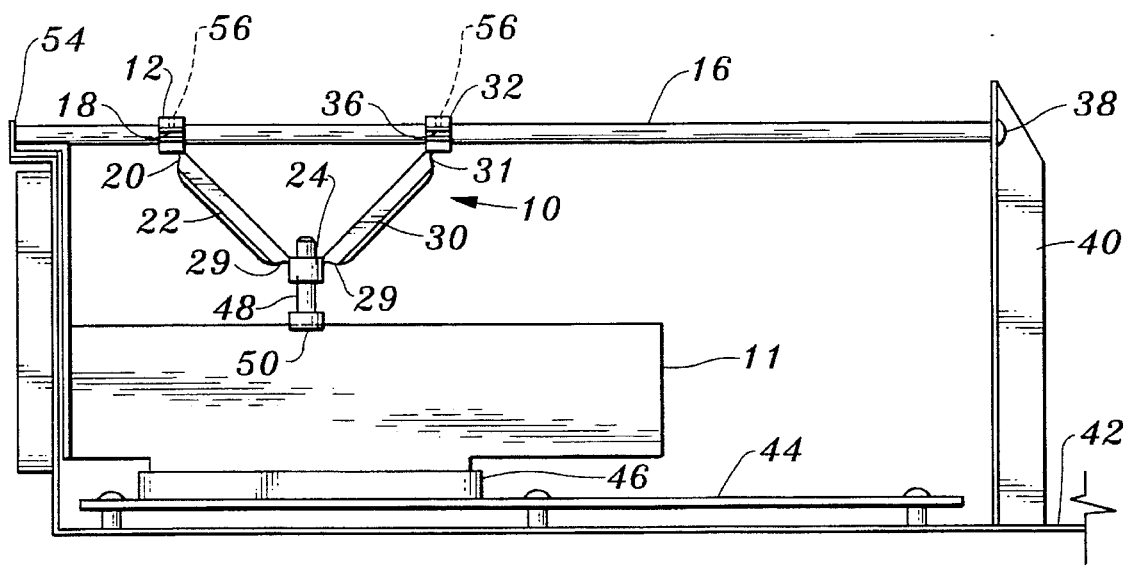
FIG. 4 is a side perspective view of such a fastener attached to a support rod and an add-on short printed wiring board, according to the invention.

With reference now to FIG. 4, an extender element or extender element 48 is shown for use with short or narrow printed wiring boards. Extender element 48 preferably includes an elongated portion and a slotted mounting portion 50 for attaching the printed wiring board. Extender element 48 is preferably fitted through aperture 28 of central fastening element 24 and is, in the preferred embodiment, composed of nylon, however, plastic, rubber, metal, or other durable, resilient materials may be used.

Figure 5:
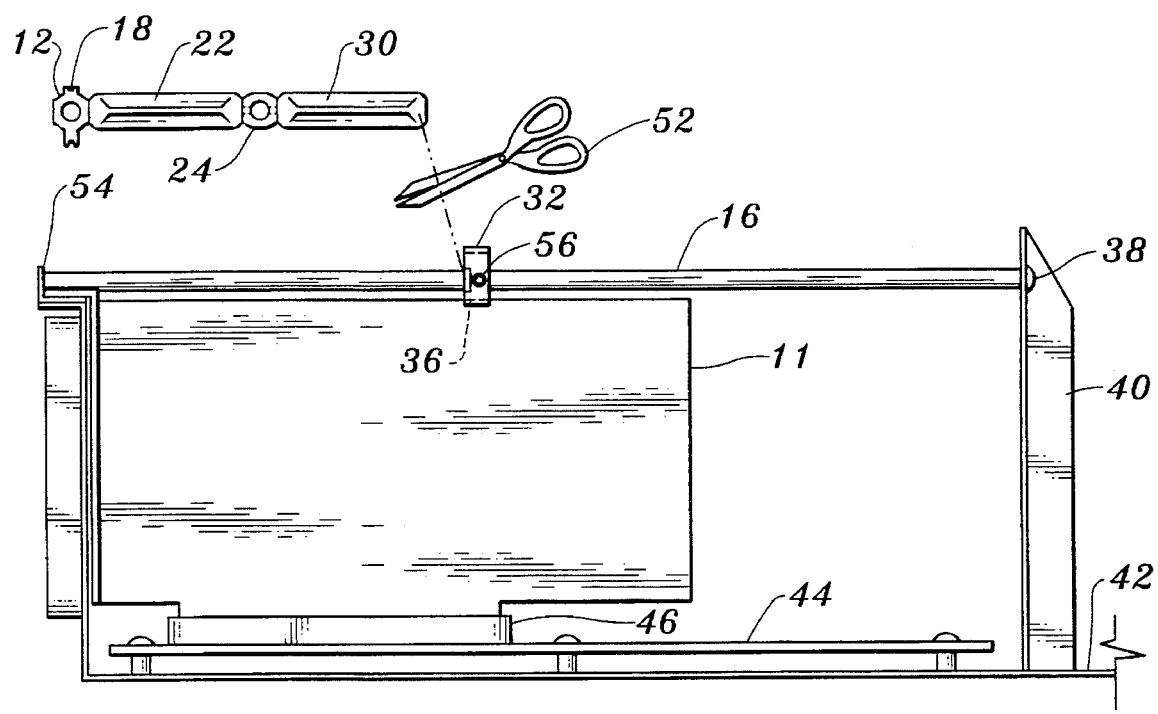
FIG. 5 shows a means of adapting such a fastener by clipping off an end element for a maximum height printed wiring board, according to the invention.

Referring now to FIG. 5, another embodiment of fastener 10 is shown for use when a printed wiring board of a maximum height for the card cage is used. In such a case, a scissors 52 or other cutting implement may be used to cut either first end element 12 or second end element 32 from fastener 10. The separated end element may then be used to position and secure the printed wiring board to support element 16 as shown. Whether fastener 10 is used as described and shown in FIGS. 1–4, or used as modified and shown in FIG. 5, fastener 10 allows for positioning and securing fastener 10 individually at any position along printed wiring board 11 so as to accommodated edge connectors, LEDs or other features which require access or clearance. When a printed wiring board is installed only the fasteners needed to hold down that particular printed wiring board need be installed. When a printed wiring board is removed from the card cage, only the particular fasteners holding that printed wiring board need be removed.

In operation and use printed wiring board fastener 10 is very convenient and easy to use with any card cage which can accommodate a support element 16 at each add-on card position. This is easily accomplished by providing a slotted flange 54 to the card cage at each end of the add-on card area. No other modifications or design changes are needed. This allows for use off fastener 10 on a very wide range of computers.

To install and use with printed wiring boards within the height range of the complete fastener first fastener 10 is installed on support element 16. Then screw 38 or other fastener is loosely installed into each end of the support element 16. The support element 16 is then installed into the card cage at the printed wiring board location desired and screws 38 are then tightened. Fastener 10 maybe moved back and forth on support element 16 until it is at a desired location along the length of the printed wiring board, The height of fastener 10 may be adjusted by squeezing the ends together for short printed wiring boards or spreading them apart for taller boards, The printed wiring board then fits into slot 26 of central fastening element 24. Then set screws 56 or other locking device are tightened securely holding fastener 10 to support element 16.

For installation of very short or narrow printed wiring boards it may be necessary to use extender element 48 as shown in FIG. 4. To install, extender element 48 is inserted into aperture 28 in central fastening element 24. Then fastener 10 is installed as described above. The height of fastener 10 may then be adjusted by squeezing the ends together until central fastening element is about 75 percent of the height between support element 16 and the printed wiring board. Extender element 48 may then be screwed in or out until the printed wiring board fits into the slotted element 50 on extender 48. Fastener 10 is then moved on support element 16 until it is at the location desired along the length of the printed wiring board. Next, set screws 56 are tightened and the support element 16 is adjusted either up or down in the card cage slots until the printed wiring board fits into the slot of slotted element 50 on extender 48 and then screws 38 are tightened.

As is evident from the above description, a wide variety of sizes and configurations of fasteners may be fashioned from the present invention. Different sizes of fasteners and materials used to compose the fasteners may also be used. Accordingly, additional advantages and modification will readily occur to those skilled in the art. The invention in its broader aspects is, therefore, not limited to the specific details, representative apparatus and illustrative examples shown and described. Accordingly, departures from such details may be made without departing from the spirit or scope of the applicant's general inventive concept.

What is claimed is:

1. An adjustable printed wiring board fastener, comprising:

an elongated fastening element having a first end element secured to a first fastening section; a central fastening element being secured at one end thereof to said first fastening element and including means for attachment of said central fastening element to a printed wiring board; a second fastening section secured at one end to said central fastening element, said second fastening section including a second end element secured to the second fastening section; said first end element including means for adjustably attaching said elongated fastening element to a support element; and, said second end element including means for adjustably attaching said elongated fastening element to a said support element.

2. The adjustable printed wiring board fastener of claim 1, wherein said means for attachment of said central fastening element to a printed wiring board comprises a slotted element adapted for attachment to said printed wiring board, said slotted element including a horizontally extending attachment slot operably positioned thereon.

3. The adjustable printed wiring board fastener of claim 1, wherein said means for adjustably attaching said printed wiring board fastener of said first end element to a support element comprises a centrally positioned aperture adapted to receive and secure said support element; said first end element further including a pair of vertically oriented slots adapted to secure and receive a printed wiring board therein.

4. The adjustable printed wiring board fastener of claim 1, wherein said means for adjustably attaching said printed wiring board fastener of said second end element to said support element comprises a centrally positioned aperture adapted to receive and secure said support element; said first end element further including a pair of vertically oriented slots adapted to secure and receive a printed wiring board therein.

5. The adjustable printed wiring board fastener of claim 1, wherein said first fastening section is hingedly secured to said central fastening element.

6. The adjustable printed wiring board fastener of claim 1, wherein said second fastening section is hingedly secured to said central fastening element.

7. The adjustable printed wiring board fastener of claim 1, wherein said support element comprises an elongated support rod including means for releasable attachment to a card cage.

8. The adjustable printed wiring board fastener of claim 7, wherein said means for releasable attachment of said elongated support rod to said card cage comprises a pair of locking screws adapted for attachment at both ends of the elongated support rod.

9. The adjustable printed wiring board fastener of claim 1, further including an extender element being adapted for mounting within an aperture of said central fastening element and including a mounting portion including a slot for securing and receiving a printed wiring board.

10. The adjustable printed wiring board fastener of claim 1, wherein said elongated fastening element is composed of a plastic.

11. The adjustable printed wiring board fastener of claim 1, wherein said elongated fastening element is composed of a stamped sheet metal.

12. The adjustable printed wiring board fastener of claim 1, wherein said elongated fastening element is composed of wire.

13. The adjustable printed wiring board fastener of claim 1, wherein said elongated fastening element is composed of a composite.

14. The adjustable printed wiring board fastener of claim 1, wherein said first end element is operably detached from the printed wiring board fastener and used alone to secure said printed wiring board within a personal computer.

15. The adjustable printed wiring board fastener of claim 1, wherein said second end element is operably detached from the printed wiring board fastener and used alone to secure said printed wiring board within a personal computer.

* * * * *